United States Patent [19]

Kulick

[11] Patent Number: 5,130,762
[45] Date of Patent: Jul. 14, 1992

[54] INTEGRATED QUANTUM WELL FEEDBACK STRUCTURE

[75] Inventor: John D. Kulick, Pittstown, N.J.

[73] Assignee: AMP Incorporated, Harrisburg, Pa.

[21] Appl. No.: 616,161

[22] Filed: Nov. 20, 1990

[51] Int. Cl.$^5$ .................. H01L 31/08; H01L 31/12
[52] U.S. Cl. ........................ 357/19; 357/30;
330/59; 330/308; 307/491; 307/494
[58] Field of Search .............. 357/30, 19; 330/308, 330/59; 307/491, 494

[56] References Cited

U.S. PATENT DOCUMENTS

| | | | |
|---|---|---|---|
| 3,611,173 | 10/1971 | Goulding et al. | 330/59 |
| 3,955,149 | 5/1976 | Trilling | 330/300 |
| 4,284,960 | 8/1981 | Ryan | 330/300 |
| 4,625,105 | 11/1986 | Hentschel | 250/205 |
| 4,744,105 | 5/1988 | Kasper | 455/619 |
| 4,794,609 | 12/1988 | Hara et al. | 357/19 |
| 4,801,993 | 1/1989 | Ankri et al. | 357/19 |
| 4,947,400 | 8/1990 | Dutta | 357/19 |
| 5,001,522 | 3/1991 | Takahashi | 357/16 |

FOREIGN PATENT DOCUMENTS 2218431 10/1973 Fed. Rep. of Germany .
2030020 3/1980 United Kingdom .

OTHER PUBLICATIONS

Ogawa, "Considerations for Optical Receiver Design" IEEE Journal on Selected Areas in Comm., vol. SAC-1, No. 3, Apr. 1983, 524–532.

Chemla, "Quantum Wells for Photonics", Physics Today, May 1985, pp. 52–64.

Koren et al., "Low Internal Loss Separate Confinement Heterostructure in GaAs IngaAsP Quantum Well Laser", Appl. Phys. Lett. 51(21) 23 Nov. 1987, 1744–1746.

Zielinski et al., "Optical Gain & Loss Processes in GaInAs/InP MQW Laser Structures", IEEE Journal, vol. 25, No. 6, Jun. 1989, 1407–1406.

Koren et al., "Low-Loss InGaAs/InP Multiple Quantum Well Optical Electroabsorption Waveguide Modulator", Appl. Phys. Lett. 51(15) 12 Oct. 1987, pp. 1132–1134.

Wood, "Multiple Quantum Well (MQW) Waveguide Modulator" IEEE Journal of Light Wave Technology, vol. 6, No. 6, Jun. 1988, pp. 743–757.

*Primary Examiner*—Jerome Jackson, Jr.

[57] ABSTRACT

An integrated semiconductor device comprising a light emitting portion and a light detecting portion is disclosed. The integrated semiconductor device comprises two multiple quantum well P-I-N structures formed on a single substrate, one of the P-I-N structures being forward biased to emit light and the other of the P-I-N structures being reverse biased to detect light. Because of the quantum confined Stark effect, the reversed biased P-I-N structures is highly absorbing to light emitted by the forward biased P-I-N structure. The integrated semiconductor device may be utilized to implement an optical feedback path for a receiver.

4 Claims, 4 Drawing Sheets

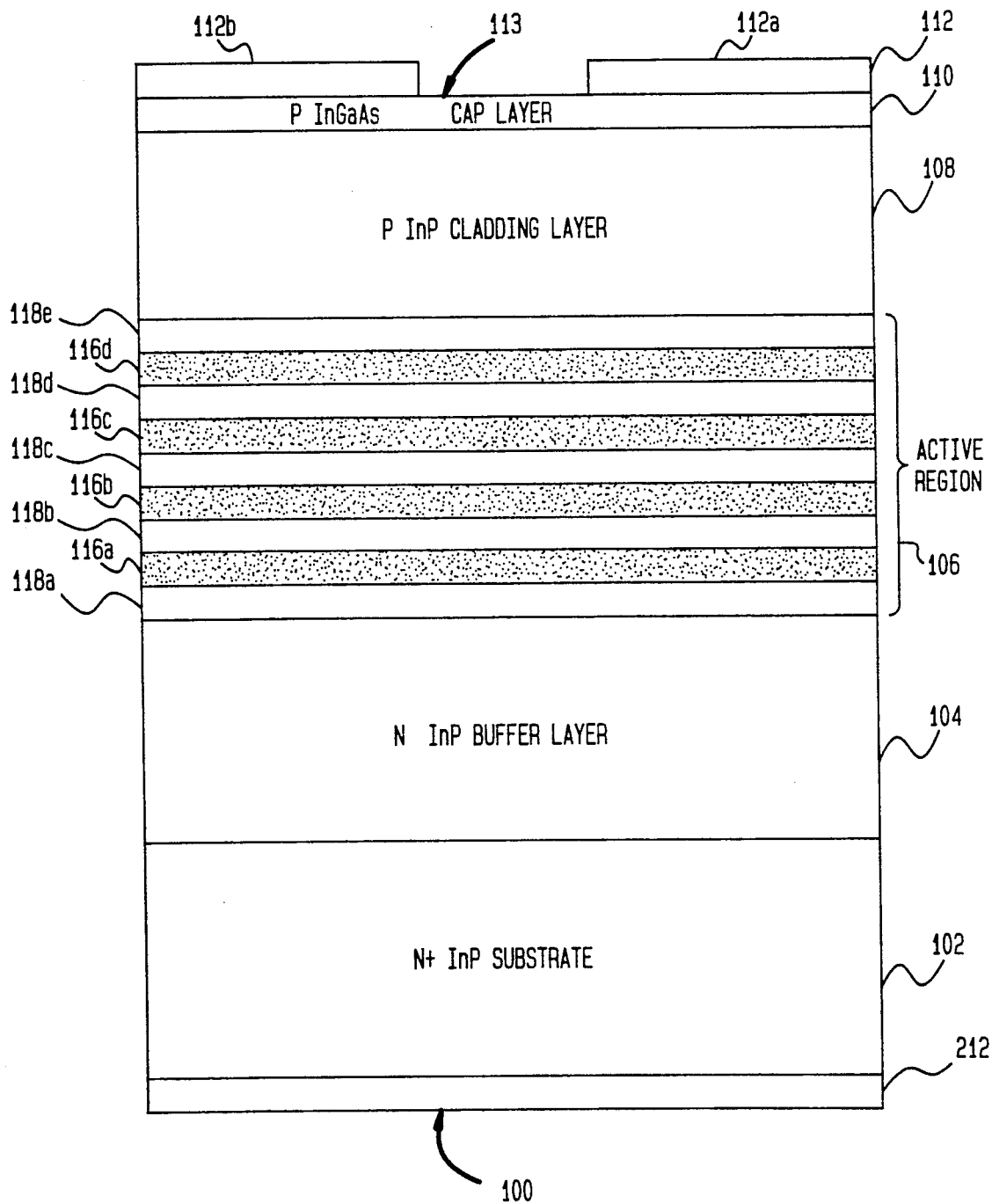

INTEGRATED QUANTUM WELL FEEDBACK STRUCTURE

FIELD OF THE INVENTION

The present invention relates to a light emitting diode and a P-I-N diode integrated into a single quantum well semiconductor structure. The integrated structure is especially useful for implementing a receiver which utilizes optical feedback.

BACKGROUND OF THE INVENTION

Receivers for optical signals are useful in a wide variety of applications including optical communication systems. As presently contemplated, such systems typically have a light source and receiver optically coupled to each other by means of an optical fiber pathway. Information is usually transmitted by varying the intensity of optical radiation and the rate of variation is referred to as the bit rate. An optical receiver detects an incoming optical signal and either regenerates the optical signal or converts it to an electrical signal.

The optical receiver should have a high sensitivity. The optical receiver should also have a large dynamic range. Additionally, typical optical communications systems operate within a wide range of bit rates. A common approach for achieving high sensitivity and wide bandwidth for an optical receiver, is to use a transimpedance amplifier. (See, e.g., Ogawa, "Considerations For Optical Receiver Design" IEEE Journal on Selected Areas in Communications", VOL SAC-1, No. 3, April 1983, pp. 524–532). This type of amplifier has a resistance to provide electrical feedback between the amplifier output and input. With this configuration, the feedback resistance must be very large so that the Johnson noise from the feedback resistance is less than the amplifier noise. Such a large resistance causes several problems. For example, the dynamic range of the receiver is limited because very large amplifier output voltage swings are needed for an appreciable current flow through the feedback resistor. Additionally, the bandwidth is limited because any parasitic capacitance in parallel with the feedback resistance produces a large RC time constant.

A receiver utilizing optical feedback between the amplifier output and the amplifier input eliminates many of the problems associated with the feedback resistance in a transimpedance amplifier while providing the necessary current feedback to achieve wide dynamic range. Such a receiver comprises an operational amplifier having a positive and a negative input and an output. Illustratively, the negative input of the operational amplifier is connected to a voltage $-V/2$. Connected to the output of the operational amplifier via a resistor is a light source such as an LED. Connected to the positive input of the operational amplifier is a feedback photodetector, illustratively in the form of a P-I-N photodiode. There is an optical path between the light source and feedback photodetector. There is also a signal photodetector connected to the positive input of the operational amplifier. The signal photodetector and the feedback photodetector are connected in series with the anode of the signal photodetector being connected to a voltage $-V$ and the cathode of the feedback photodetector being connected to ground. The signal photodetector receives the incoming optical signal. During receiver operation, negative feedback as a result of optical transmission between the light source at the amplifier output and the feedback photodetector insures that the optical level at the feedback detector is large enough so that the photo-current in the feedback detector balances the photo-current in the signal detector.

The use of optical feedback has a number of significant advantages in comparison to the conventional transimpedance amplifier. In particular, the optical feedback coupling eliminates the feedback resistance as a noise source and the parasitic capacitance as a bandwidth limitation. It also insures that the amplifier output voltage swing is small resulting in a wide dynamic range.

Thus, the use of optical feedback in an optical receiver provides significant advantages over the use of a resistance to define a feedback path.

Presently, receivers using optical feedback are implemented with discrete light emitting and photodetecting components in the feedback path (see, e.g., U.S. Pat. No. 4,744,105; U.S. Pat. No. 3,955,149; U.S. Pat. No. 4,284,960; U.S. Pat. No. 4,625,105; U.S. Pat. 3,611,173; UK patent application no. 2,030,020A and German Patent Document No. 2, 218,431).

In contrast to the use of discrete components to implement a light source and photodetector to provide a feedback path for a receiver, it is an object of the present invention to provide a single integrated semiconductor device including a light emitting diode and a P-I-N photodetector for use in providing an optical feedback path for a receiver.

Toward this end, it is useful to consider a multiple quantum well structure. While discrete multiple quantum well lasers and modulators are well known (see, e.g., Daniel S. Chemia "Quantum Wells for Photonics" Physics Today, May 1985, pp 52–64; U. Koren et al "Low Internal Loss Separate Confinement Heterostructure InGaAs/InGaAsP Quantum Well Laser" Appl. Phys. Lett 51(21) 23 Nov. 1987 1744–1746; E. Zielinski et al "Optical Gain and Loss Processes in GaInAs/InP MQW Laser Structures" IEEE Journal of Quantum Electronics Vol. 25, No. 6 June 1989 pp 1407-1406, U. Koren et al "Low-loss InGaAs/InP Multiple Quantum Well Optical Electroabsorbtion Waveguide Modulator" Appl. Phys. Lett. 51(15) 12 Oct. 1987, pp 1132–1134; T. H. Wood "Multiple Quantum Well (MQW) Waveguide Modulator" IEEE Journal of Light Wave Technology Vol.6, No. 6 June 1988 pp 743–757), a single integrated multiple quantum well structure including both a light emitter and a photodetector for providing an optical feedback path for a receiver has heretofore not been realized. Accordingly, it is a further object of the invention to provide a single integrated multiple quantum well structure which includes both a light emitter and a photodetector for implementing an optical feedback path for a receiver.

SUMMARY OF THE INVENTION

An integrated multiple quantum well structure, including a light emitting diode and a photodetector, may be formed as follows. In an illustrative embodiment of the invention, a P-I-N structure is formed on a substrate. Illustratively, the P-I-N structure is formed on an N+type substrate and comprises in sequence an N type buffer layer, an unintentionally doped active region comprising a plurality of thin narrow bandgap quantum well layers separated by thicker wider bandgap barrier layers, a P type cladding layer formed on the active region, and P+type cap layer formed on the P type cladding layer.

This P-I-N structure is then divided into two parts by removing a portion of each of the layers by etching a channel down to the substrate. What results is two P-I-N structures formed on a single substrate and separated by a narrow channel. This resulting structure, through the use of metalization layers and electrodes may be connected to an amplifier to form a feedback path. In operation, one of the two P-I-N structures is forward biased to form an edge emitting LED, i.e., light is emitted on the sides of the LED from the active region. The other P-I-N structure is reverse biased to form a photodiode. Light emitted from the LED propagates across the narrow channel between the LED and the photodiode where it is absorbed in the active region and detected. Thus, a single integrated structure including an LED and photodetector has been achieved.

It should be noted that the active region of the reverse biased photodiode is highly absorbing to the radiation emitted by the LED. The reason relates to the quantum-confined Stark effect which occurs when a set of multiple quantum wells is subjected to an electric field oriented perpendicular to the layers defining the wells as is the case when the above-described P-I-N photodiode structure is reverse biased. In particular, the quantum-confined Stark effect shifts the absorption edge of the active region of the P-I-N photodiode into a portion of the spectrum where the active region would normally be transparent, so that the active region of the photodiode absorbs and detects radiation emitted by the LED.

BRIEF DESCRIPTION OF THE DRAWINGS

FIGS. 2A and 2B schematically illustrate the formation of a single integrated multiple quantum well structure including light emitting and light detecting portions, for use in the receiver of FIG. 1, in accordance with an illustrative embodiment of the present invention.

DETAILED DESCRIPTION OF THE INVENTION

Figure 1:
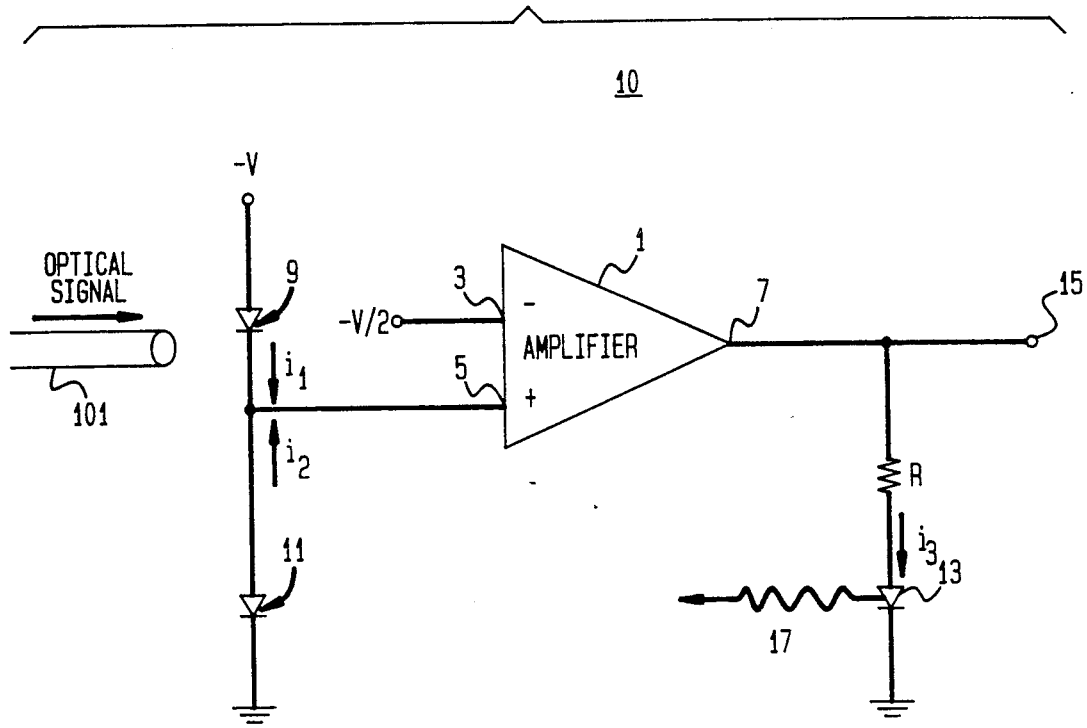
FIG. 1 schematically illustrates an optical receiver including an optical feedback path.

An optical receiver 10 including an optical feedback path is illustrated in FIG. 1. The receiver 10 comprises an operational amplifier 1. The operational amplifier 1 has a negative input terminal 3, a positive input terminal 5 and an output terminal 7. The negative input terminal 3 is connected to a voltage $-V/2$. Connected to the positive input terminal 5 are two photodetectors 9 and 11. Illustratively, the photodetectors 9 and 11 are P-I-N diodes. The photodetectors 9 and 11 are reverse biased as the anode of the photodetector 9 is connected to a negative voltage source $-V$ and the cathode of the photodetector 11 is connected to ground. An optical signal to be detected by the receiver 10 is transmitted via the optical fiber 101 and is incident on the photodetector 9. Connected to the output terminal 7 of the amplifier through series resistance R is light source 13. This light source is illustratively a light emitting diode having a P-I-N structure. The light emitting diode 13 is forward biased. The output signal of the receiver is taken at terminal 15. The series resistance R is utilized to convert the signal output voltage at terminal 15 to a proportional current i3. The light output of the light emitting diode 13 has an intensity proportional to i3.

There is an optical feedback path 17 between the light source 13 and photodetector 11. The feedback path, which optically couples the elements 13 and 11, may be free space or it may comprise an optical wave guide. Also, use of a lens or integrated optics is contemplated.

The receiver 10 operates as follows. The signal photodetector 9 generates a current i1 in response to an optical signal received via the fiber 101. Negative feedback via the optical path 17 insures that the optical signal level at the feedback photodetector 11 is large enough so that the current i2 produced by the feedback photodetector 11 balances the current i1 produced by the signal photodetector 9.

It should be noted that the optical wavelength used for transmission via the feedback path 17 does not have to be the same as the optical wavelength used for transmission of the signal via the optical fiber 101. It should also be noted that the receiver 10 need not be an optical receiver at all, but may instead serve as a receiver for a signal in electrical form. Illustratively, the optical fiber 101 and signal photodetector 9 can in this case be replaced in the receiver 10 by another type of source for the current i1, which current i1 can then be balanced by the current i2 generated as a result of optical feedback.

Figure 2B:
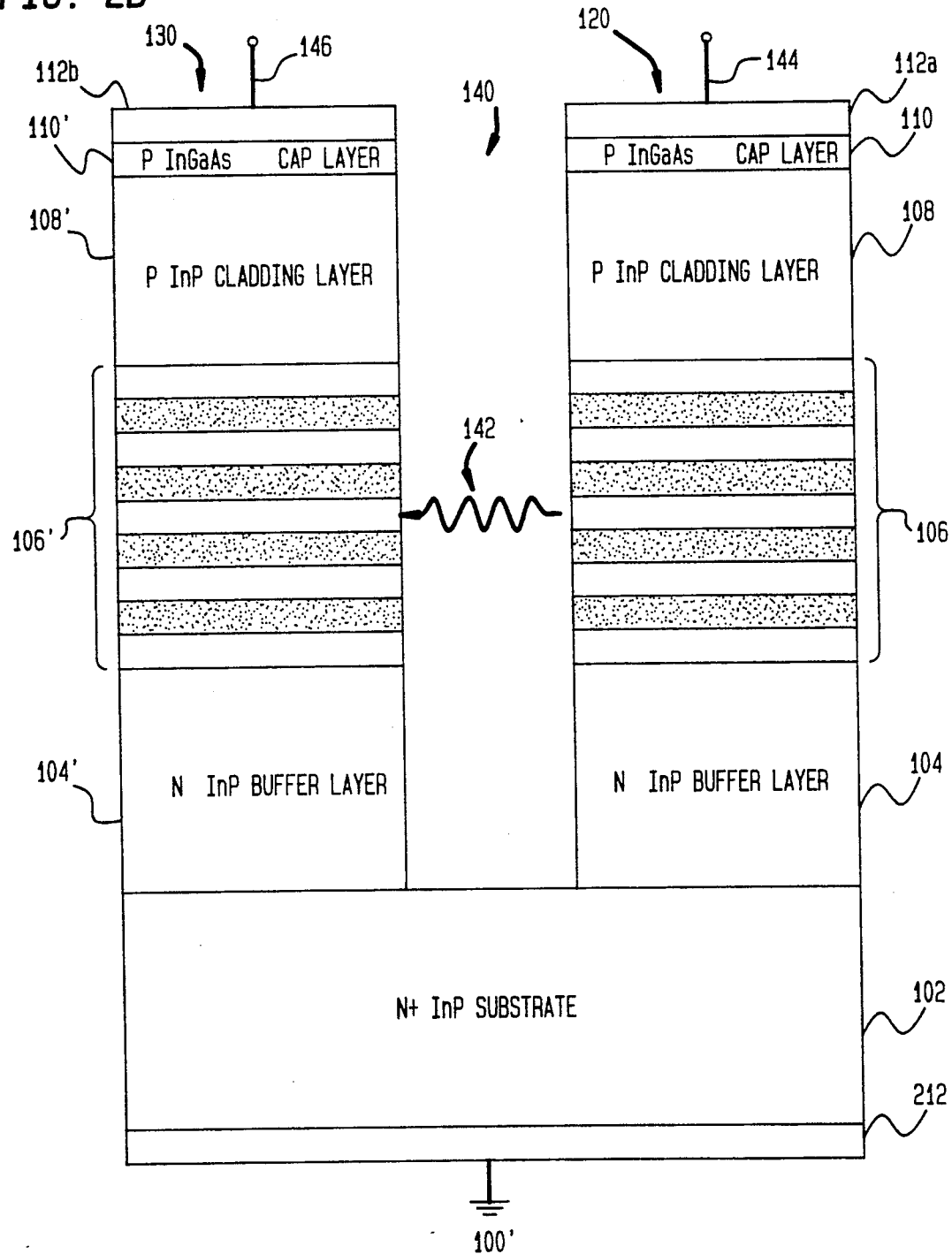

FIGS. 2A and 2B illustrate the formation of an integrated light source and detector for use in forming the feedback path of the receiver 10 of FIG. 1.

More particularly, FIG. 2A shows a multiple quantum well P-I-N structure 100 formed on an N+type InP substrate 102. A growth technique such as MOCVD is used to form on the substrate a buffer layer 104, an active region 106 which comprises multiple quantum wells, a cladding layer 108, and a cap layer 110. The metal contact layers 112 and 212 are formed later by electron beam deposition of metal layers.

More particularly, the substrate 102 has a thickness of about 380 mm and a dopant concentration of about $2 \times 10^{18}$ cm$-3$. The buffer layer 104 has a thickness of about 3 mm and is formed from N type InP which is Sulphur doped with a concentration of about 10$^{18}$ cm$-3$.

The active region 106 illustratively comprises four 80-Angstrom-thick InGaAs narrow bandgap quantum well layers 116a, 116b, 116c, 116d. The quantum well layers are separated by the 300-Angstrom-thick InGaAsP wider bandgap barrier layers 118a, 118b, 118c, 118d, and 118e. The quantum well and barrier layers which form the active region 106 are not intentionally doped and have a background carrier concentration which is N type on the order 10$^{15}$ cm$-3$.

The cladding layer 108 has a thickness of 0.5 mm and is formed from P type InP. The cladding layer 108 is doped with Zinc to a concentration of about 10$^{17}$ cm$-3$. The cap layer 110 is formed from P+InGaAs. The cap layer has a thickness of 0.5 mm and a dopant concentration on the order of 10$^{19}$ cm$-3$.

On top of the cap layer, a metal contact layer 112 is formed. The metal contact layer 112 comprises Ti/Pt/Au followed by additional gold. It should be noted that in FIG. 2A the metal contact layer is divided into two portions 112a and 112b. A metal contact layer 212 is also formed on the bottom of the substrate 102. The metal contact layer 212 is formed from GeAuNi followed by additional gold. An etching step divides the structure 100 of FIG. 2A into two distinct portions one of which serves as a light emitter and the other of which serves as a light detector. More particularly, the space 113 between the metal layer portions 112a and 112b is etched down to the substrate to form a channel so as to divide the P-I-N structure 100 into two portions.

As shown in FIG. 2B, the structure 100' which results from the etching step comprises two distinct P-I-N structures 120 and 130 formed on the substrate 102 and separated by the channel 140. Thus in FIG. 2B, the structure 120 comprises the N type buffer layer 104, the multiple quantum well active region 106, the P type cladding layer 108, the cap layer 110 and the metal contact 112a. The P-I-N structure 130 comprises the N type buffer layer 104', the multiple quantum well active region 106', the P type claddinq layer 108', the cap layer 110' and the metal contact 112b. The width of the channel 140 is preferably about 0.5 mm. This dimension can be varied to help adjust the coupling efficiency from the emitter section 120 to the detection section 130.

Illustratively, to cause the P-I-N structure 120 to act as an emitter, it is forward biased. In this case, the active region 106 of the structure 120 emits radiation 142 at about 1.54 mm. As shown in FIG. 2B, the radiation is emitted from the edges of the structure 120 coincident with the borders of the active region 106 rather than from the top or bottom surface. Some of the radiation 142 propagates across the channel 140 to the P-I-N structure 130. The P-I-N structure 130 acts as a photodetector when it is reverse biased. In this case, the radiation 142 is absorbed in the active region 106' of the P-I-N structure 130 to generate carriers which form a photo-current.

To utilize the structure 100' of FIG. 2B to form the feedback path for the receiver 10 of FIG. 1, the substrate 102 is grounded by connecting the metal contact layer 212 to ground. The electrode 144 connected to metal contact layer 112a is used to connect the structure 120 to the resistance R at the output 7 of the amplifier 1 of FIG. 1. Similarly, the electrode 146 connected to the metal contact layer 112b is used to connect the structure 130 to the positive input 5 of the amplifier 1 of FIG. 1. It is a desirable feature of the P-I-N structures 120 and 130 that the active regions 106 and 106' be multiple quantum well active regions. In this case, when the structure 130 is reverse biased, the active region 106' is highly absorbing for the radiation emitted by the active region 106 of the forward biased structure 120. The reason for this is the quantum-confined Stark effect which is exhibited by multiple quantum well structures when an electric field is a applied perpendicular to the layers which define the wells.

Figure 3:
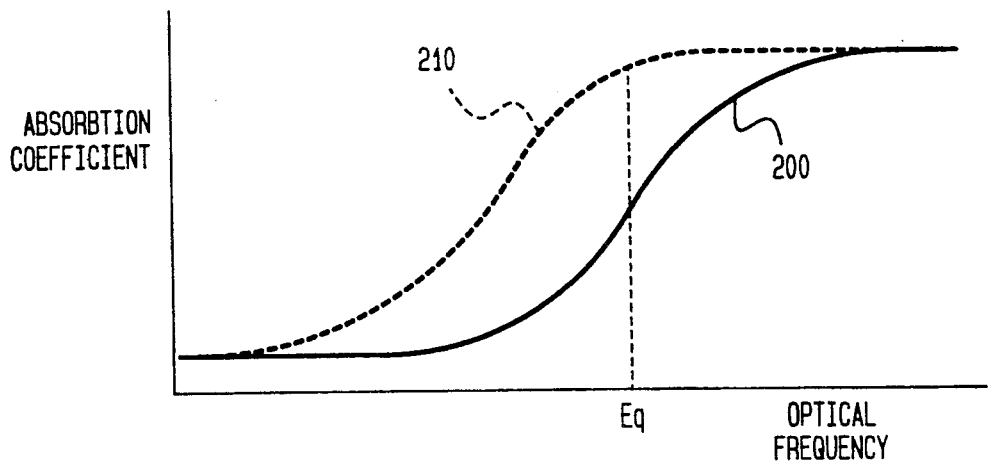
FIG. 3 illustrates the shift in the absorption edge of the multiple quantum well light detector incorporated into the structure of FIG. 2B as a result of the quantum confined Stark effect.

The quantum-confined Stark effect for a P-I-N structure such as the structure 130 with a multiple quantum well active region may be understood in connection with FIG. 3. In FIG. 3, the curve 200 is plot of optical frequency versus absorption coefficient for the active region 106' of the light detecting structure 130 when no bias voltage is applied. When the light emitting structure 120 is forward biased, it emits radiation at a frequency corresponding to the bandgap energy Eg of the quantum well layers. As shown by the curve 200 of FIG. 3, energy Eg is not in the region of the spectrum where the active region 106' of the structure 130 is highly absorbing when the structure 130 is not reverse biased. When an electric field is applied perpendicular to the multiple quantum wells of the active region 106' of the structure 130 by applying a reverse bias voltage, the absorption curve is shifted as indicated by the curve 210 so that the active region 106' is now highly absorbing to the radiation at a frequency corresponding to Eg produced by the light emitting device 120.

An additional reason for forming the active regions 106,106'of the structures 120 and 130 of FIG. 2B as multiple quantum wells is that when the structure 120 is forward biased to act as a light emitting device, the quantum well nature of the active region 106 enhances the light output efficiency of the device compared to a normal double heterostructure device. This is desirable because in the optical feedback circuit of FIG. 1, the amplifier 1 will have only limited drive current capability.

In short, an integrated semiconductor device comprising a light emitting portion and a light detecting portion has been disclosed. The integrated semiconductor device comprises two multiple quantum well P-I-N structures formed on a single substrate, one of the P-I-N structures being forward biased to emit light and the other P-I-N structure being reverse biased to detect light. Because of the quantum confined Stark effect, the reverse biased P-I-N structure is highly absorbing to the light emitted by the forward biased P-I-N structure. The integrated semiconductor device may be utilized to implement an optical feedback path for a receiver. In particular, the inventive semiconductor device may be used to implement the devices 13 and 11 in the optical receiver of FIG. 1 as a single integrated structure.

Figure 4:
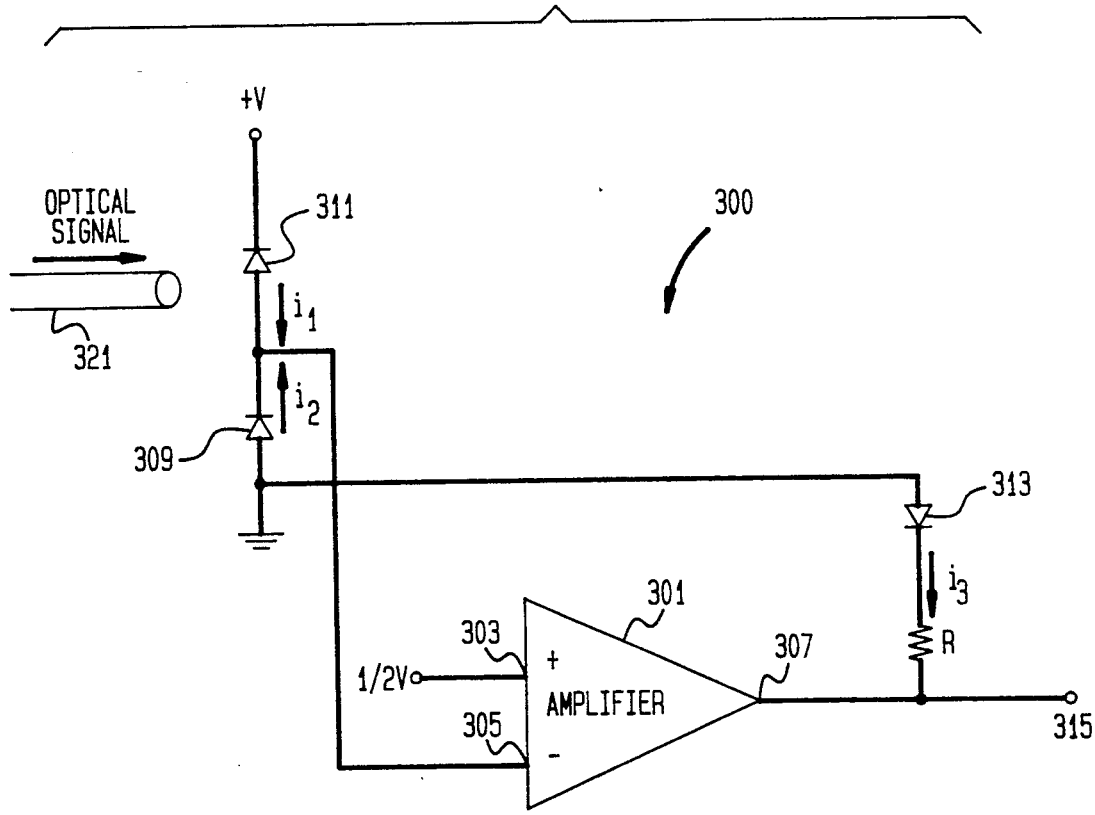
FIG. 4 illustrates an alternative optical receiver including an optical feedback path.

FIG. 4 shows an alternative optical receiver 300 having an optical feedback path which can be implemented by the integrated structure of FIG. 2B.

The receiver 300 of FIG. 4 comprises an operational amplifier 301. The operational amplifier 301 has a positive input terminal 303, a negative input terminal 305 and an output terminal 307. The positive input terminal 303 is connected to a voltage +V/2. Connected to the negative input terminal 305 are two photodetectors 309 and 311. Illustratively, the photodetectors 309 and 311 are P-I-N diodes. The photodetectors 309 and 311 are reverse biased as the cathode of the photodetector 311 is connected to a positive voltage source +V and the anode of the photodetector 309 is connected to ground. An optical signal to be detected by the receiver 300 is transmitted via the optical fiber 321 and is incident on the photodetector 311. Connected to the output terminal 307 of the amplifier through series resistance R is light source 313. This light source is illustratively a light emitting diode having a P-I-N structure. The light emittinq diode 313 is forward biased. The output signal of the receiver is taken at terminal 315. The series resistance R is utilized to convert the signal output voltage at terminal 315 to a proportional current i3. The light output of the light emitting diode 13 has an intensity proportional to i3.

There is an optical feedback path between the light source 313 and photodetector 309. The signal photodetector 311 generates a current i1 in response to an optical signal received via the fiber 321. Negative feedback via the optical path insures that the optical signal level at the feedback photodetector 309 is large enough so that the current i2 produced by the feedback photodetector 309 balances the current i1 produced by the signal photodetector 311. In FIG. 4, the light emitting device 313 and the detector device 309 are implemented as a single integrated semiconductor structure as shown in FIG. 2B.

Finally, the above described embodiments of the invention are intended to be illustrative only. Numerous alternative embodiments may be devised by those skilled in the art without departing from the spirit and scope of the following claims.

I claim:

1. A receiver comprising an amplifier having an input and an output, signal detecting means connected to said input for generating a first current in response to a signal, a feedback circuit connected between said output and said input for generating a second current for balancing said first current generated by said signal detecting means, said feedback circuit comprising:
 a single integrated semiconductor device including a substrate, a light emitter in the form of a first P-I-N structure formed on said substrate and having a first multiple quantum well active region, and a detector in the form of a second P-I-N structure formed on said substrate and having a second multiple quantum well active region, said first P-I-N structure being forward biased by voltages at the output of said amplifier to emit light, said second P-I-N structure being connected to said input of said amplifier, and means for maintaining a constant reverse bias voltage on said second P-I-N structure to shift an absorption edge of the active region of the second P-I-N structure into a portion of the spectrum wherein the active region of the second P-I-N structure is normally transparent to enable said second P-I-N structure to absorb light emitted by said first P-I-N structure to generate said second current.

2. The receiver of claim 1 wherein said light emitter is an LED.

3. The receiver of claim 1 wherein said first P-I-N structure is connected by way of a resistance to said output of said amplifier.

4. The receiver of claim 1 wherein said signal detecting means comprises a photodetector.

* * * * *